(12) United States Patent
Ikushima

(10) Patent No.: US 6,861,095 B1
(45) Date of Patent: Mar. 1, 2005

(54) METHOD OF UNIFORMLY APPLYING A PASTE ON A PASTE APPLYING BODY

(75) Inventor: Kazumasa Ikushima, Mitaka (JP)

(73) Assignee: Musashi Engineering, Inc., Mitaka (JP)

(*) Notice: Subject to any disclaimer, the term of this patent is extended or adjusted under 35 U.S.C. 154(b) by 0 days.

(21) Appl. No.: 09/830,582

(22) PCT Filed: Aug. 11, 1999

(86) PCT No.: PCT/JP99/04347

§ 371 (c)(1),
(2), (4) Date: Aug. 2, 2001

(87) PCT Pub. No.: WO00/29128

PCT Pub. Date: May 25, 2000

(30) Foreign Application Priority Data

Nov. 13, 1998 (JP) .......................................... 10/324167

(51) Int. Cl.[7] ................................................ B05D 1/26
(52) U.S. Cl. ......................... 427/261; 427/287; 427/96
(58) Field of Search ............................... 427/256, 261, 427/287, 207.1, 208.2, 96; 29/830–832, 877; 156/356; 438/118–119, 455

(56) References Cited

U.S. PATENT DOCUMENTS 4,803,124 A * 2/1989 Kunz ......................... 428/200
4,824,006 A * 4/1989 Shimizu
5,932,012 A * 8/1999 Ishida et al. ................. 118/669
5,985,069 A * 11/1999 Kawabe et al.
6,348,234 B1 * 2/2002 Ozono et al. ............. 427/207.1

FOREIGN PATENT DOCUMENTS

| JP | 04-237305 | 8/1992 |
|---|---|---|
| JP | 06-061276 | 3/1994 |
| JP | 06-296930 | 10/1994 |
| JP | 10-144703 | 5/1998 |

* cited by examiner

Primary Examiner—Fred J. Parker
(74) Attorney, Agent, or Firm—Westerman, Hattori, Daniels & Adrian, LLP

(57) ABSTRACT

A method of forming a paste pattern with no variations in liquid amount while preventing a bubble from being entrapped in a step of bonding a bonded member. The drawing pattern is linearly drawn with a paste on the paste-applied body by using a nozzle, the paste, a paste reserving container, and paste supply means. The paste line is drawn while moving any of the paste-applied body, the nozzle and the paste. The paste-applied body can be a lead frame, and the paste can be an adhesive for die bonding. The drawing pattern is a figure made up of a plurality of segment lines, preferably a figure in the radial form. The drawing pattern can be a figure including an enclosed shape. At least one segment line is formed of two drawn lines by moving any of the paste-applied body, the nozzle and the paste to go and return. The start and end points of drawn lines can be positioned other than the ends of the drawing pattern.

11 Claims, 4 Drawing Sheets

(B)

(A)

(B)

(A) (B)

(A)

(B)

Bubble
(C)

(A)

(B)

No bubble
(C)

METHOD OF UNIFORMLY APPLYING A PASTE ON A PASTE APPLYING BODY

INDUSTRIAL TECHNICAL FIELD

The present invention relates to a method of uniformly applying a paste, on the surface of a metal piece.

The term "paste" used in the present invention means a paste, e.g., an adhesive and paint, which has such a level of viscosity as allowing the liquid material to be laid on the paste-applied surface in the linear form. One example of the liquid material is a thermosetting conductive resin.

The term "paste-applied body" used in the present invention means a body having the surface on which the paste is to be applied. One example of the paste-applied body is a lead frame.

PRIOR ART

A conductive paste for use in the semiconductor manufacturing process is applied in the form of dots at predetermined positions on a strip of metal called a lead frame.

With an increasing size of semiconductor devices, multi-dot nozzles have been employed to apply a large amount of pastes at a time. With such an applying technique, however, a bubble is apt to be entrapped between the back surface of a semiconductor chip and a lead frame when the semiconductor chip is mounted in a predetermined position. Although various improvements in outer diameter, layout, etc. of the nozzles have been devised, satisfactory solutions have not yet been achieved.

PROBLEMS TO BE SOLVED BY THE INVENTION

The above prior-art method has such a drawback that when the applied pastes are subject to a drying step with a bubble left entrapped, the bubble is so expanded as to destroy semiconductor devices. Another drawback is that the multi-dot nozzles must be designed and manufactured in match with the sizes of semiconductor devices and the shapes of lead frames case by case An object of the present invention is to provide a paste pad forming method which can apply a paste, with much less variations in liquid amount than resulted by the prior-art method of arranging a number of nozzles in a desired drawing pattern for multi-dot coating, and which can completely prevent a bubble from being entrapped in a step of bonding a bonded member, e.g., a semiconductor chip, to paste-applied body, e.g., a lead frame, through the applied paste.

BRIEF DESCRIPTION OF THE DRAWINGS

FIG. 5(A) shows a multi-dot coating process using a plurality of nozzles, FIG. 5(B) shows projection of pastes beyond sides of a semiconductor chip after bonding, and FIG. 5(C) shows a bubble entrapped near the center of the bonded semiconductor chip.

FIG. 6(A) shows linear coating using a nozzle, FIG. 6(B) shows uniform projection of a paste beyond sides of a semiconductor chip after bonding, and FIG. 6(C) shows that no bubble is entrapped near the center of the bonded semiconductor chip.

MEANS FOR SOLVING THE PROBLEMS

Figure 1:
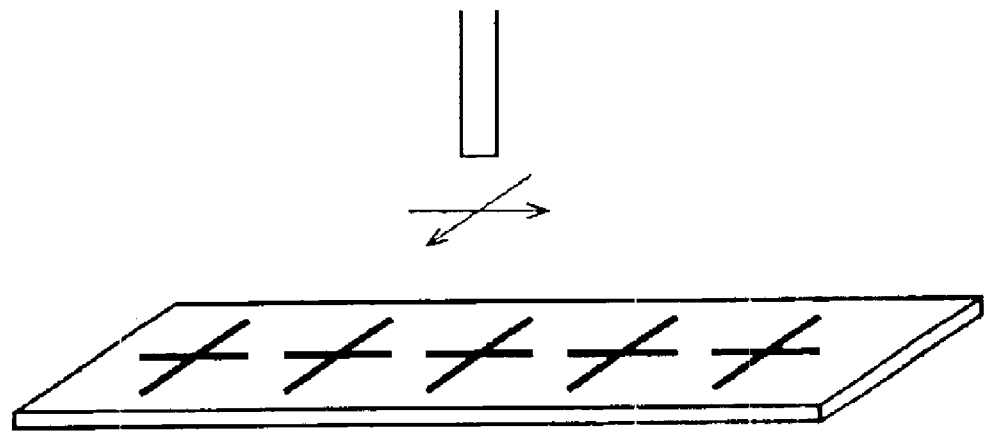
FIG. 1 schematically shows one embodiment of the present invention in which a paste in the linear form is successively drawn on a lead frame following a locus of movement of a nozzle.

The present invention provides a paste pattern forming method which can solve the above-mentioned problems encountered in the prior art, and is featured in that a drawing pattern is formed on a paste-applied body with a linearly drawn paste line. In the method of the present invention, the drawing pattern is linearly drawn with a paste on the paste-applied body by using a nozzle, the paste, a paste reserving container, and paste supply means. Accordingly, the present invention also resides in a paste pattern forming method wherein a drawing pattern is formed on a paste-applied body with a linearly drawn paste line by using a nozzle, the paste, a paste reserving container, and paste supply means.

The paste is continuously discharged from the nozzle while the paste line is being drawn. Accordingly, the present invention further resides in a paste pattern forming method wherein a drawing pattern is formed on a paste-applied body with a linearly drawn line of a paste continuously discharged from a nozzle.

Specifically, the present invention also provides a paste pattern forming method wherein a drawing pattern is formed on a paste-applied body with a linearly drawn line of a paste continuously discharged from a nozzle by using the nozzle, the paste, a paste reserving container, and paste supply means. In this method, the paste line is drawn while moving any of the paste-applied body, the nozzle and the paste. Thus, the present invention further provides a paste pattern forming method wherein a drawing pattern is formed on a paste-applied body with a linearly drawn line of a paste continuously discharged from a nozzle by using the nozzle, the paste, a paste reserving container, and paste supply means while any of the paste-applied body, the nozzle and the paste is moved.

In the above method, the paste-applied body is a lead frame, and the paste is an adhesive for die bonding.

In this case, the present invention resides in a die-bonding adhesive pattern forming method wherein a drawing pattern is formed on a lead frame with a linearly drawn line of the adhesive for die bonding. Also, the present invention resides in a die-bonding adhesive pattern forming method wherein a drawing pattern is formed on a lead frame with a linearly drawn line of an adhesive for die bonding by using a nozzle, the adhesive for die bonding, a die-bonding adhesive reserving container, and die-bonding adhesive supply means.

Further, the present invention resides in a die-bonding adhesive pattern forming method wherein a drawing pattern is formed on a lead frame with a linearly drawn line of a die-bonding adhesive continuously discharged from a nozzle.

Specifically, the present invention also provides a die-bonding adhesive pattern forming method wherein a drawing pattern is formed on a lead frame with a linearly drawn line of a die-bonding adhesive continuously discharged from a nozzle by using the nozzle, the adhesive for die bonding, a die-bonding adhesive reserving container, and die-bonding adhesive supply means. Further, the present invention provides a die-bonding adhesive pattern forming method wherein a drawing pattern is formed on a lead frame with a linearly drawn line of a die-bonding adhesive continuously discharged from a nozzle by using the nozzle, the adhesive for die-bonding, a die-bonding adhesive reserving container, and die-bonding adhesive supply means while any of the lead frame, the nozzle and the adhesive for die bonding adhesive is moved.

EMBODIMENTS OF THE INVENTION

An embodiment of the method of the present invention for forming applying a paste in a variety of drawing patterns will be described.

Typical patterns drawn with an applied pattern are figures made up of a plurality of line segments. The term "line segment" used herein means linear portions of the drawing patterns formed by drawn paste lines. When the drawing pattern is a cross, for example, it is a figure made up of four line segments. The drawing patterns are preferably in the radial form. The method of the present invention is applied to, e.g., a step of die-bonding a semiconductor chip to a ceramic package (PKG) in manufacture of a semiconductor device. In such a case, by applying an adhesive in the radial form, good bonding is achieved between the semiconductor chip and the PKG when the semiconductor chip placed on the adhesive is closely bonded to the PKG under a uniform pressing force, because the adhesive satisfactorily spreads over the applied surface of the PKG even with the semiconductor chip having a large size.

The drawing pattern may be a figure including the enclosed form. In the drawing pattern made up of a plurality of line segments, at least one of the line segments is preferably formed of two drawn lines. These two drawn lines are preferably formed by drawing a line segment with a first path in one direction and a second path in the opposite direction tracing the first path. Specifically, at least one line segment is formed by moving a nozzle, a paste-applied body, or a paste in such a manner as to go and return over a predetermined distance. By so forming a plurality of line segments, one drawing pattern, i.e., one figure, can be obtained. In such a case, one line segment can be drawn to extend from one start point to one end point, or a plurality of line segments can be drawn to extend from one start point to one end point. Preferably, the drawing pattern is formed while the start and end points of the drawn lines are kept from being positioned other than the end points. By forming the drawing pattern so that the start and end points of the drawn lines are positioned other than the end points of a figure of the applied adhesive, the start and end points of the drawn paste lines are positioned near the center of the figure. Therefore, when a uniform force is pressed against the semiconductor chip placed on the applied adhesive, the adhesive is forced to very uniformly spread outward and no bubble is entrapped on that occasion. Also, the drawing pattern is preferably formed with a minimum number of corners.

A means for forming a drawing pattern with drawn paste lines comprises a nozzle, a paste, a container for storing the paste, and a paste supply means. The drawing pattern forming means is not particularly limited so long as it serves as an apparatus for discharging the paste, supplied from the container storing the paste therein, through the nozzle in constant amount and can realize the method of the present invention. In view of the necessity of drawing a minute line figure on a lead frame or the like at a high speed with high accuracy, however, it is preferable to employ a liquid constant-amount discharging apparatus which has been invented by the inventor and filed for a patent previously.

The liquid constant-amount discharging apparatus comprises, by way of example, a liquid reserving container, a means for directly or indirectly pressurizing a liquid in the liquid reserving container, a discharge valve for mechanically opening and closing a discharge port held in communication with the liquid reserving container, a pressure sensor for detecting a liquid pressure near the discharge port, and a control means for controlling the operation of the pressurizing means in accordance with a signal from the pressure sensor. With this apparatus, upon receiving a pressure signal and a pressurizing time signal, the pressurizing means pressurizes the liquid in the liquid reserving container to a pressure corresponding to the pressure signal for a time corresponding to the pressurizing time signal. Further, at the timing in match with the operation of the pressurizing means, the discharge valve is opened to discharge the liquid through the discharge port, thus enabling the discharge of the liquid to be started without a time lag. When the time during which the liquid is pressurized by the pressurization means reaches a predetermined time and the amount of the liquid discharged reaches a predetermined amount, the discharge valve is mechanically closed in timed relation to stop of the operation of the pressurizing means. Since the discharge port is physically closed upon closing of the discharge valve, a good liquid wiping property can be obtained. It is also possible to completely prevent an unexpected leakage of the liquid after the discharge port is once closed.

After one discharge cycle is completed in this way, the liquid pressure near the discharge port is detected by the pressure sensor and a resulting pressure signal is inputted to the control means. In accordance with the pressure signal, the control means controls the pressurizing means to raise or lower the liquid pressure so that the residual pressure near the discharge port is held at a predetermined characteristic value. It is a matter of course that when the detected liquid pressure is aligned with the predetermined characteristic value, the pressurizing means is not required to be operated again.

By thus always holding the residual pressure near the discharge and hence the inner pressure in a liquid flow passage at a constant value after the end of the discharge cycle port, and thereby removing variations of a flow passage condition, the pressurizing force, the pressurizing time, etc. for the liquid can be determined with no need of considering any uncertain factors, when a constant amount of the liquid is discharged in the next cycle. Also, the constant-amount discharge of the liquid can be performed with high accuracy. In the case in which one cycle of the liquid discharge is continued for a relatively long time as resulted, for example, when the liquid is applied in the linear form, it is preferable that the liquid pressure be detected with the pressure sensor during the discharge cycle and the liquid pressurizing force applied by the pressurizing means be controlled in accordance with a detected result.

In the above-described apparatus, the discharge valve is preferably a needle valve. Because a needle itself can be made sufficiently small in size, the needle valve can be smoothly and rapidly displaced to open and close with a relatively small driving force even under a high pressure on the order of approximately 100–200 kgf/cm². It is therefore possible to improve the liquid wiring property at the end of the discharge cycle, and to more effectively remove a time lag at the start of the discharge cycle.

A reduction of the driving force also results in a smaller overall size of the discharge valve. In addition, more preferably, a liquid pressure compensating piston is provided on the needle valve.

With the provision of the liquid pressure compensating piston, pressure variations in the liquid flow passage, especially at and near the discharge port, can be precisely compensated in an easy and rapid manner by displacing the liquid pressure compensating piston to advance and retract. For example, when the needle valve is operated to open, the volume of the needle which occupies a space near the discharge port, and conversely when the needle valve is operated to close, the volume of the needle which occupies that space is increased. Accordingly, in the former case, a decrease of the liquid pressure near the discharge port can be prevented by displacing the liquid pressure compensating piston to advance. Also, in the latter case, an increase of the liquid pressure near the discharge port can be prevented by displacing the liquid pressure compensating piston to contract.

Thus, the liquid pressure compensating piston can be employed along with or in place of the pressurizing means to hold the pressure of the liquid remaining after the end of the discharge cycle at the predetermined characteristic value.

Further, in the case in which the discharge nozzle requires to be moved with respect to a workpiece in the above-described apparatus, it is more preferable that the discharge nozzle be moved by controlling, for example, a manipulator in the orthogonal coordinate system or in the three-dimensional directions in synch with control of the discharge valve.

OPERATIONAL ADVANTAGES

Since a paste line is continuously drawn by moving the nozzle, the paste-applied body, or the paste itself, variations of the applied paste are much less than resulted in the case of arranging a number of nozzles in a desired drawing pattern for multi-dot coating.

Since a drawing pattern can be formed on the paste-applied body with linearly drawn paste lines, i.e., since one figure can be drawn by the so-called one stroke drawing method, a highly accurate figure can be drawn at a high speed.

By storing the pattern to be drawn in the form of a programs a desired paste drawing pattern can be easily selected with no need of nozzle exchange work.

Any drawing pattern having an arbitrary shape, i.e., any figure having an arbitrary shape, can be drawn. In a step of bonding a bonded member, e.g., a semiconductor chip, to a paste-applied body, e.g., a lead frame, it is possible to draw such a figure as allowing the paste to evenly spread over the entire paste-applied surface and enabling the bonded member to be bonded to the paste-applied body in a satisfactory manner; namely such a figure as preventing a bubble from being entrapped and causing the paste to project in even amount from side surfaces of the bonded member after the bonding step.

In particular, each drawing pattern can be drawn in any desired form with one start point and one end point, the drawing pattern can be formed such that the start and end points of the drawn paste line are positioned other than the ends of the figure, and the positions and number of raised points of the paste can be controlled. In the operation of bonding the bonded member such as a semiconductor chip, the paste forming the figure is pushed to spread over the entire paste-applied surface toward an outer periphery of the bonded member.

EXAMPLES

Details of the present invention will be described below in connection with examples. It should be understood that the present invention is limited in no way by the following examples.

Example 1

In this Example, a paste-applied member (lead frame here) was disposed below a nozzle as a manner of moving the nozzle in the XYZ directions. Alternatively, the nozzle may be moved by any of a manner of moving the lead frame in the XYZ directions, a manner of moving the nozzle only in the Z direction and moving the lead frame in the XY directions, and a manner of externally applying stresses to the paste itself discharged from the nozzle and drawing a paste line on the lead frame in the XY directions.

The nozzle was connected to the tip of a container reserving the paste therein. The past was discharged through the nozzle by a supply means (not shown).

As shown in FIG. 1, the lead frame was disposed below the nozzle and fixed in place.

Figure 2:
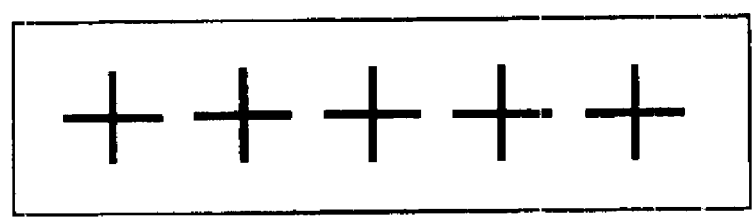
FIG. 2 shows a lead frame on which crossed patterns are drawn by a method of the present invention.
Figure 3:
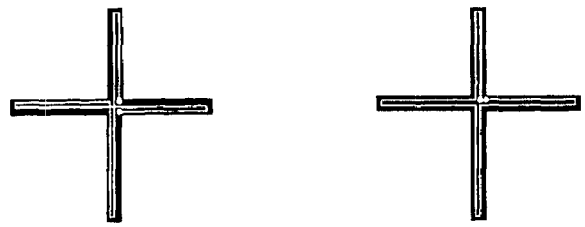
FIG. 3(A) is a representation for explaining the sequence of drawing the crossed pattern.
FIG. 3(B) is a representation for explaining the sequence of drawing the crossed pattern with which a nozzle having a smaller diameter than the width of a drawn line is employed and moved back at each end of the drawn line while the paste is discharged.
Figure 3:
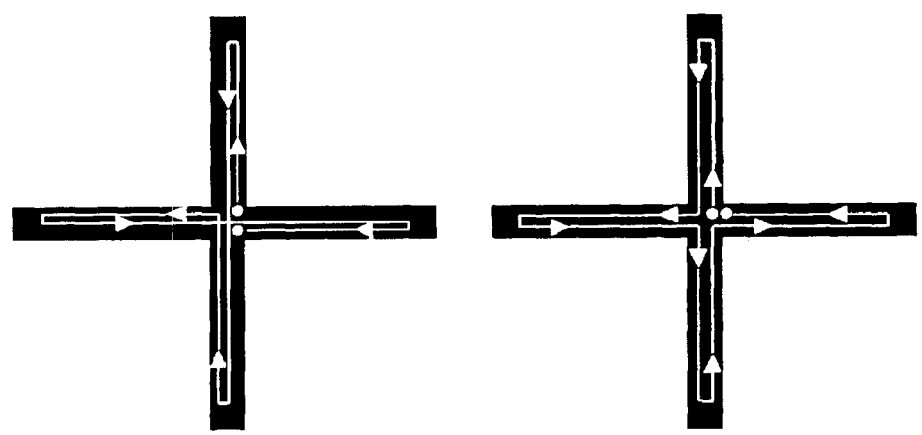
Figure 4:
FIG. 4(A) shows a step of placing a semiconductor device on the paste formed by the method of the present invention.
FIG. 4(B) shows a step of closely bonding the semiconductor device under a uniform pressing force.
Figure 4:
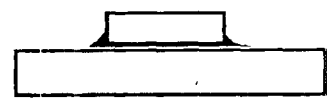
Figure 5:
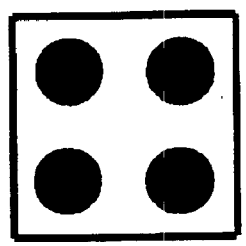
FIG. 5 shows the prior art.
Figure 5:
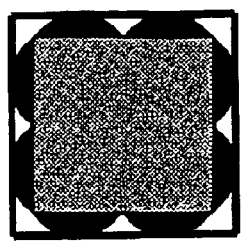
Figure 5:
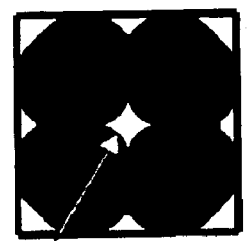
Figure 6:
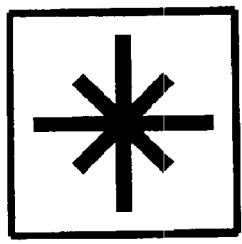
FIG. 6 is a representation for explaining the present invention.
Figure 6:
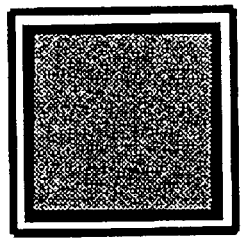
Figure 6:
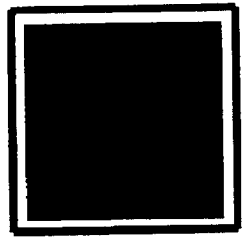

After descending the nozzle, the paste was discharged and at the same time the nozzle was moved in the XY directions. As shown in FIG. 2, linear paste lines were successively drawn on the lead frame following the locus of the nozzle.

A sequence of moving the nozzle is determined by a sequence program previously set in a movement control unit (not shown).

Practical paste line drawing procedures will be described below with reference to FIGS. 3 to 7.

FIGS. 3(A) and 3(B) show the case of drawing a crossed pattern. If the start and end points of the paste drawn line are positioned at the end, i.e., at the extremity, of the line, the discharge of the paste would be started or ended at such an end position. In this case, an extra paste would be so concentrated as not to maintain the same line width.

FIGS. 3(A) and 3(B) show an example in which the paste line drawn to return at the extremity of the line, while the paste is continuously discharged, by a nozzle having a diameter smaller than the width of the actually drawn paste line. With this example, an extra paste is prevented from concentrating at the extremity of the line.

Looking at the paste from a side, which has been applied as described above, from one side of the lead frame, the paste appears as shown in FIG. 4(A). In practice, a central portion of the applied paste is slightly higher than a peripheral portion of the applied paste due to the presence of the extra paste.

As seen from FIGS. 4(A) and 4(B) which show a step of bonding a semiconductor chip to the lead frame, the start and end points of the drawn paste line are positioned near the center in this Example. Although the extra paste gives rise to a problem if positioned at the extremity of the line, no problem occurs when the paste is positioned near the center. More specifically, in the bonding step, the paste first adheres at its raised portion to the center of a rear surface of the semiconductor chip, and then gradually spreads toward an outer periphery of the semiconductor chip under pressing. As a result, the paste is brought into a very uniform shape after the bonding of the semiconductor chip.

On the other hand, FIG. 5(A) shows the prior art, i.e., an example of multi-dot coating using a plurality of nozzles. If the bonding step is carried out in the same manner as described above, there occur variations in spread of pastes toward an outer periphery of a semiconductor chip. In addition, there also produces, as a fatal problem, a space up to which the pastes cannot spread, i.e., a bubble.

The bubble is thermally expanded in a step of fixing the semiconductor chip to the lead frame while heating and drying the paste, and may cause such a drawback as destroying the semiconductor chip due to stresses generated upon the thermal expansion of the bubble.

When the paste pattern is drawn in accordance with the sequence of the present invention as shown in FIG. 6(A), the paste has a shape shown in FIG. 6(B) after the bonding step of the semiconductor chip. Further, as shown in FIG. 6(B), the paste evenly spreads toward sides of the semiconductor chip and has a very uniform shape along the outer periphery of the semiconductor chip.

Moreover, with the start and end points of the drawn paste line positioned near the center of the semiconductor chip to be bonded, no bubble is entrapped between the semiconductor chip and the lead frame. As a result, the above problem experienced in the prior art can be prevented.

The shape of the semiconductor chip is not always square.

In the conventional multi-dot coating process using a plurality of nozzles, the nozzles are arranged in match with the shape of the semiconductor chip and must be manually exchanged by using a tool for each shape of semiconductor chips. With the present invention, by storing the pattern to be drawn in the form of a program, a desired paste drawing pattern can be very easily selected with no need of nozzle exchange work.

Figure 7:
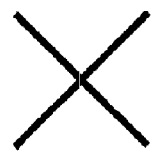
FIG. 7 shows a variety of paste patterns which can be easily formed by the method of the present invention.
Figure 7:
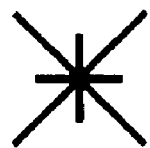
Figure 7:
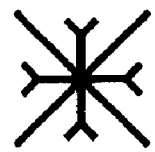
Figure 7:
Figure 7:
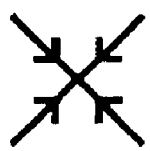
Figure 7:
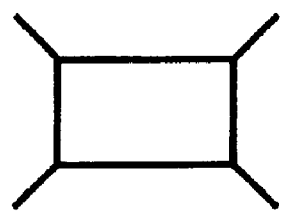
Figure 7:
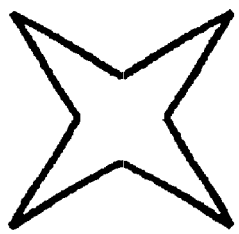
Figure 7:
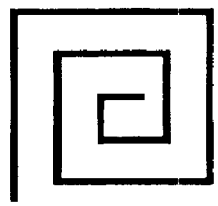
Figure 7:
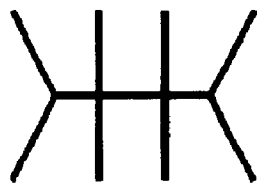
Figure 7:
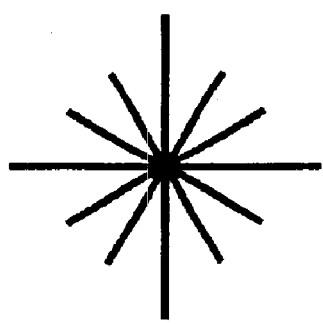

FIG. 7 shows a variety of paste patterns which can be easily formed by selection of the program.

ADVANTAGES OF THE INVENTION

A highly accurate paste pattern or figure can be drawn at a high speed. When a semiconductor chip is pressed against a paste-applied surface of a paste-applied body, the paste forming the figure is forced to spread over the entire paste-applied surface while being pushed toward an outer periphery of the semiconductor chip. Therefore, no bubble is entrapped at the bonded boundary between the semiconductor chip and the paste-applied body, and the paste evenly coats the entire paste-applied surface. As a result, products having uniform quality can be produced at a high yield, and the number of failed products due to the presence of bubbles can be minimized.

What is claimed is:

1. A method of applying a paste on a paste-applied body, comprising the steps of:

forming a two-dimensional paste pattern on a first joining surface of the paste-applied body with a drawn paste line, said two-dimensional pattern including a plurality of radially arranged segment lines; and placing on the paste pattern a second joining surface of a chip member to be bonded, wherein at least one segment line is formed of two drawn lines, and wherein no bubbles are left in the first and second joining surfaces when the first and second joining surfaces are bonded to each other.

2. A paste pattern forming method according to claim 1, wherein said paste line is drawn by using the nozzle, the paste, a paste reserving container, and paste supply means.

3. A paste pattern forming method according to claim 2, wherein said paste is continuously discharged from said nozzle while the paste line is being drawn.

4. A paste pattern forming method according to claim 2, wherein the paste line is drawn while moving any of said paste-applied body, said nozzle and said paste.

5. A paste pattern forming method according to claim 1 or 2, wherein said paste-applied body is a lead frame, and said paste is an adhesive for die bonding.

6. A paste pattern forming method according to claim 1, wherein said pattern is a figure in a radial form.

7. A paste pattern forming method according to claim 1, wherein at least one segment line is formed of two drawn lines.

8. A paste pattern forming method according to claim 7, wherein at least one segment line is formed while moving any of said paste-applied body, said nozzle and said paste traveling in two paths, of which a first path is in one direction and a second path is in the opposite direction tracing the first path.

9. A paste pattern forming method according to claim 8, wherein said two-dimensional paste pattern is formed starting and ending on the same point of said segment line.

10. A paste pattern forming method according to claim 1 or 2, wherein said drawing pattern is formed such that the start and end points of drawn lines are positioned other than the ends of said drawing pattern.

11. A method of uniformly applying a paste, comprising the steps of:

forming a radial pattern of a paste line on a first surface of a paste-applied body; and placing on the paste pattern a member with a second surface, thereby sandwiching the paste pattern with the first surface and the second surface, wherein at least one segment line is formed of two drawn lines, wherein said pattern is open in all radial directions, and wherein the paste is spread over the entire area between the first surface and the second surface leaving no bubbles in the paste.

\* \* \* \* \*